United States Patent
Uchida

(10) Patent No.: US 8,994,120 B2
(45) Date of Patent: Mar. 31, 2015

(54) MOTOR CONTROL MULTILAYER CIRCUIT BOARD

(71) Applicant: JTEKT Corporation, Osaka-shi, Osaka (JP)

(72) Inventor: Nobuhiro Uchida, Yamatotakada (JP)

(73) Assignee: JTEKT Corporation, Osaka (JP)

( * ) Notice: Subject to any disclaimer, the term of this patent is extended or adjusted under 35 U.S.C. 154(b) by 0 days.

(21) Appl. No.: 13/866,422

(22) Filed: Apr. 19, 2013

(65) Prior Publication Data
US 2013/0277761 A1 Oct. 24, 2013

(30) Foreign Application Priority Data
Apr. 23, 2012 (JP) ................. 2012-097910

(51) Int. Cl.
| | |
|---|---|
| H01L 23/495 | (2006.01) |
| H02P 6/08 | (2006.01) |
| H05K 1/18 | (2006.01) |
| H05K 1/02 | (2006.01) |
| H05K 3/46 | (2006.01) |

(52) U.S. Cl.
CPC .......... *H01L 23/49568* (2013.01); *H02P 6/085* (2013.01); *H05K 1/186* (2013.01); *H05K 1/0209* (2013.01); *H05K 3/4617* (2013.01); *H01L 2924/0002* (2013.01)
USPC ............... 257/401; 257/E23.062; 257/E23.07

(58) Field of Classification Search
CPC ..... H05K 1/0262; H05K 1/0298; H05K 1/16; H05K 1/185; H05K 1/186; H01L 23/49568; H02P 6/085
USPC ..................... 257/E23.062, E23.07
See application file for complete search history.

(56) References Cited

U.S. PATENT DOCUMENTS

| | | | |
|---|---|---|---|
| 2005/0207133 A1* | 9/2005 | Pavier et al. ............ | 361/761 |
| 2009/0189291 A1 | 7/2009 | Landau et al. | |
| 2011/0108971 A1 | 5/2011 | Ewe et al. | |
| 2011/0290537 A1 | 12/2011 | Nagase | |
| 2012/0250253 A1 | 10/2012 | Chou et al. | |

FOREIGN PATENT DOCUMENTS

| | | |
|---|---|---|
| DE | 102007036045 A1 | 2/2009 |
| DE | 102008040906 A1 | 2/2010 |
| EP | 2391192 A1 | 11/2011 |
| JP | A-2011-083063 | 4/2011 |
| WO | 2011/083578 A1 | 7/2011 |

OTHER PUBLICATIONS

Dec. 4, 2014 Search Report issued in European Application No. 13164682.0.

* cited by examiner

*Primary Examiner* — Ermias Woldegeorgis
(74) *Attorney, Agent, or Firm* — Oliff PLC

(57) ABSTRACT

A motor control multilayer printed wiring board includes: a multilayer printed wiring board having a plurality of laminated conductor layers; an upper-row FET connected to the conductor layers and configured to control a motor; a lower-row FET connected to the conductor layers and arranged at a location at which the lower-row FET overlaps with the upper-row FET in a laminated direction in which the conductor layers are laminated, the lower-row FET being configured to control the motor; and a heat dissipation mechanism arranged on the multilayer printed wiring board and arranged at a location at which the heat dissipation mechanism overlaps with at least one of the upper-row FET and the lower-row FET in the laminated direction.

4 Claims, 2 Drawing Sheets

MOTOR CONTROL MULTILAYER CIRCUIT BOARD

INCORPORATION BY REFERENCE

The disclosure of Japanese Patent Application No. 2012-097910 filed on Apr. 23, 2012 including the specification, drawings and abstract is incorporated herein by reference in its entirety.

BACKGROUND OF THE INVENTION

1. Field of the Invention

The invention relates to a motor control multilayer circuit board that includes a multilayer printed wiring board, a first field-effect transistor, a second field-effect transistor and a heat dissipation mechanism.

2. Description of Related Art

A low temperature co-fired ceramics (LTCC) multilayer board described in Japanese Patent Application Publication No. 2011-83063 (JP 2011-83063 A) includes a central processing unit (CPU) and a plurality of field-effect transistors (FETs). The CPU controls on/off switching operations of the FETs. The FETs are located at portions spaced apart from each other at predetermined intervals on one of surfaces of the LTCC multilayer board.

The motor control multilayer circuit board is, for example, mounted on an in-vehicle motor control device, and a small-area multilayer printed wiring board is desired in order to be arranged in limited space. However, when a plurality of field-effect transistors are implemented on the surface of a multilayer printed wiring board, it is required to ensure space for implementing the field-effect transistors, so it is difficult to reduce the area of the multilayer printed wiring board.

SUMMARY OF THE INVENTION

The invention provides a motor control multilayer circuit board that allows a reduction in the area of a multilayer printed wiring board.

An aspect of the invention provides a motor control multilayer circuit board. The motor control multilayer circuit board includes: a multilayer printed wiring board having a plurality of laminated conductor layers; a first field-effect transistor connected to the conductor layers and configured to control a motor; a second field-effect transistor connected to the conductor layers and arranged at a location at which the second field-effect transistor overlaps with the first field-effect transistor in a laminated direction in which the conductor layers are laminated, the second field-effect transistor being configured to control the motor; and a heat dissipation mechanism arranged on the multilayer printed wiring board and arranged at a location at which the heat dissipation mechanism overlaps with at least one of the first field-effect transistor and the second field-effect transistor in the laminated direction.

With the above motor control multilayer circuit board, the first field-effect transistor and the second field-effect transistor overlap with each other in the laminated direction in which the conductor layers are laminated. Therefore, in comparison with the case where the first field-effect transistor and the second field-effect transistor are arranged on the surface of the multilayer printed wiring board, it is possible to reduce the area of the multilayer printed wiring board. In addition, it is possible to dissipate heat generated from at least one of the first field-effect transistor and the second field-effect transistor with the use of the heat dissipation mechanism that overlaps with the at least one of the first field-effect transistor and the second field-effect transistor in the laminated direction.

In the motor control multilayer circuit board according to the above aspect, at least one of the first field-effect transistor and the second field-effect transistor may be incorporated in the multilayer printed wiring board.

With the above motor control multilayer circuit board, the multilayer printed wiring board incorporates at least one of the first field-effect transistor and the second field-effect transistor, so it is not required to arrange the at least one of the first field-effect transistor and the second field-effect transistor on the surface of the multilayer printed wiring board. Thus, it is possible to increase the flexibility of design and arrangement of the heat dissipation mechanism that is arranged on the surface of the multilayer printed wiring board.

In the motor control multilayer circuit board according to the above aspect, both the first field-effect transistor and the second field-effect transistor may be incorporated in the multilayer printed wiring board.

With the above motor control multilayer circuit board, the multilayer printed wiring board incorporates both the first field-effect transistor and the second field-effect transistor, so it is not required to arrange the first field-effect transistor and the second field-effect transistor on the surface of the multilayer printed wiring board. Thus, it is possible to further increase the flexibility of design and arrangement of the heat dissipation mechanism that is arranged on the surface of the multilayer printed wiring board.

In the motor control multilayer circuit board according to the above aspect, the first field-effect transistor and the second field-effect transistor may be serially connected to each other by a serial line, the first field-effect transistor may be configured to function as a switching element that is arranged on a higher potential side than the second field-effect transistor, and the second field-effect transistor may be configured to function as a switching element that is arranged on a lower potential side than the first field-effect transistor.

With the above motor control multilayer circuit board, the first field-effect transistor and the second field-effect transistor overlap with each other in the laminated direction, so it is possible to shorten the serial line that serially connects the high potential-side switching element and the low potential-side switching element to each other.

In the motor control multilayer circuit board according to the above aspect, the first field-effect transistor and the second field-effect transistor each may be a power MOSFET having a gate terminal and a source terminal at one surface and having a drain terminal at the other surface, and the source terminal of the first field-effect transistor may be arranged at a position at which the source terminal of the first field-effect transistor overlaps with the drain terminal of the second field-effect transistor in the laminated direction.

With the above motor control multilayer circuit board, the source terminal of the first field-effect transistor is arranged at a location at which the source terminal of the first field-effect transistor overlaps with the drain terminal of the second field-effect transistor, so it is possible to reduce the distance from the source terminal of the first field-effect transistor to the drain terminal of the second field-effect transistor. Thus, it is possible to further shorten the serial line.

In the motor control multilayer circuit board according to the above aspect, the heat dissipation mechanism may be arranged on each surface of the multilayer printed wiring board via an insulator.

The above motor control multilayer circuit board includes the heat dissipation mechanism that is arranged on each surface of the multilayer printed wiring board via the insulator, so it is possible to improve the heat dissipation effect in comparison with the configuration that the heat dissipation mechanism is arranged only on one surface of the multilayer printed wiring board.

According to the aspect of the invention, it is possible to provide the motor control multilayer circuit board that allows a reduction in the area of the multilayer printed wiring board.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
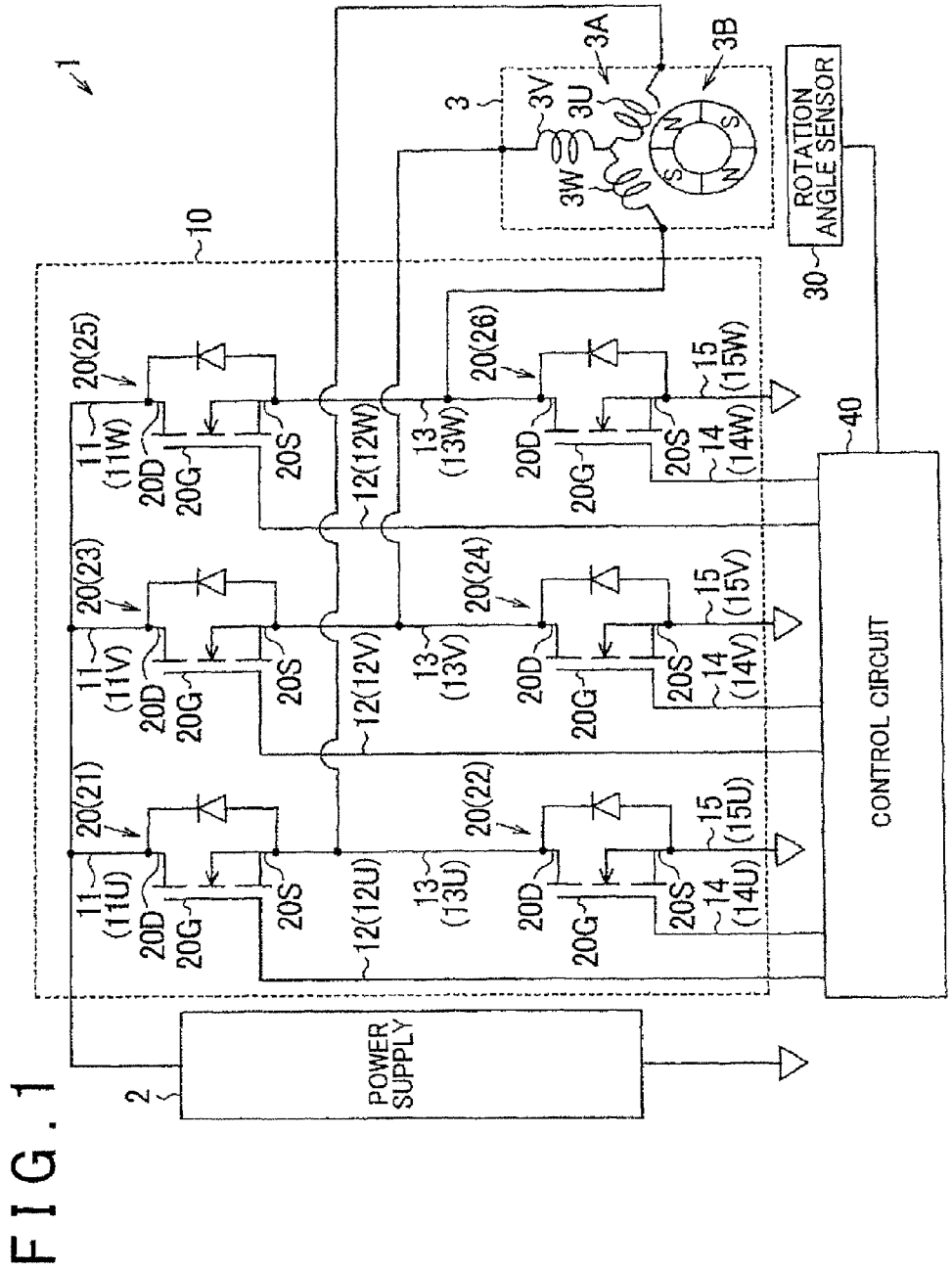
FIG. 1 is a configuration view that shows the overall configuration of a motor control device according to an embodiment of the invention.

An in-vehicle motor control device 1 will be described with reference to FIG. 1. The motor control device 1 includes an inverter circuit 10, a rotation angle sensor 30 and a control circuit 40. The motor control device 1 drives a motor 3 using electric power from a power supply 2.

The power supply 2 is, for example, formed of an in-vehicle battery or power generating device. The power supply 2 functions as a direct-current power supply. The power supply 2 supplies electric power to the motor 3 via the inverter circuit 10.

The motor 3 is, for example, formed of an assist motor for an electric power steering system or an oil pump motor for an electric hydraulic power steering system. The motor 3 includes a stator 3A and a rotor 38.

The stator 3A has a U-phase coil 3U, a V-phase coil 3V and a W-phase coil 3W. The U-phase coil 3U, the V-phase coil 3V and the W-phase coil 3W are connected to one another by a Y connection collectively at a neutral point.

The rotor 3B has N-poles and S-poles. The N-poles and the S-poles are located alternately in the rotation direction of the rotor 38. The rotor 313 rotates relative to the stator 3A due to revolving magnetic fields that are generated by the stator 3A.

The inverter circuit 10 converts direct current, which is supplied from the power supply 2, to three-phase alternating currents, and supplies the three-phase alternating currents to coils 3U, 3V, 3W of the stator 3A. The inverter circuit 10 includes a plurality of field-effect transistors 20 (hereinafter, "FETs 20"), drain lines 11, upper-row gate lines 12, serial lines 13, lower-row gate lines 14 and source lines 15. The FETs 20 each are formed of a power metal-oxide-semiconductor field-effect transistor (MOSFET).

Each of the FETs 20 has a drain terminal 20D that constitutes a drain, a gate terminal 20O that constitutes a gate and a source terminal 20S that constitutes a source. In each MOSFET, the gate and the channel are electrically insulated from each other. The channel is a current path between the drain and the source. In each N-channel FET 20, the drain terminal 20D is arranged on a higher potential side than the source terminal 20S.

The FETs 20 of the inverter circuit 10 include the two U-phase direct-coupled FETs 21, 22. The U-phase direct-coupled FETs 21, 22 are serially connected to each other by the serial line 13U. The U-phase direct-coupled FET 21 functions as a switching element that is arranged on a higher potential side than the U-phase direct-coupled FET 22. Thus, the U-phase direct-coupled FET 22 functions as a switching element that is arranged on a lower potential side than the U-phase direct-coupled FET 21.

The FETs 20 of the inverter circuit 10 include the two V-phase direct-coupled FETs 23, 24. The V-phase direct-coupled FETs 23, 24 are serially connected to each other by the serial line 13V. The V-phase direct-coupled FET 23 functions as a switching element that is arranged on a higher potential side than the V-phase direct-coupled FET 24. Thus, the V-phase direct-coupled FET 24 functions as a switching element that is arranged on a lower potential side than the V-phase direct-coupled FET 23.

The FETs 20 of the inverter circuit 10 include the two W-phase direct-coupled FETs 25, 26. The W-phase direct-coupled FETs 25, 26 are serially connected to each other by the serial line 13W. The W—phase direct-coupled FET 25 functions as a switching element that is arranged on a higher potential side than the W-phase direct-coupled FET 26. Thus, the W-phase direct-coupled FET 26 functions as a switching element that is arranged on a lower potential side than the W-phase direct-coupled FET 25.

The drain lines 11 connect the power supply 2 to the U-phase direct-coupled FET 21, the V-phase direct-coupled FET 23 and the W-phase direct-coupled FET 25. The drain lines 11 of the inverter circuit 10 include the drain line 11U for the U-phase direct-coupled FET 21, the drain line 11V for the V-phase direct-coupled FET 23 and the drain line 11W for the W-phase direct-coupled FET 25.

The upper-row gate lines 12 connect the control circuit 40 to the U-phase direct-coupled FET 21, the V-phase direct-coupled FET 23 and the W-phase direct-coupled FET 25. The upper-row gate lines 12 of the inverter circuit 10 include the upper-row gate line 12U for the U-phase direct-coupled FET 21, the upper-row gate line 12V for the V-phase direct-coupled FET 23 and the upper-row gate line 12W for the W-phase direct-coupled FET 25.

The serial lines 13 connect the inverter circuit 10 to the coils 3U, 3V, 3W of the motor 3. The serial lines 13 of the inverter circuit 10 include the U-phase serial line 13U, the V-phase serial line 13V and the W-phase serial line 13W.

The lower-row gate lines 14 connect the control circuit 40 to the U-phase direct-coupled FET 22, the V-phase direct-coupled FET 24 and the W-phase direct-coupled FET 26. The lower-row gate lines 14 of the inverter circuit 10 include the lower-row gate line 14U for the U-phase direct-coupled FET 22, the lower-row gate line 14V for the V-phase direct-coupled FET 24 and the lower-row gate line 14W for the W-phase direct-coupled FET 26.

The source lines 15 connect the U-phase direct-coupled FET 22, the V-phase direct-coupled FET 24 and the W-phase direct-coupled FET 26 to a reference potential point. The source lines 15 of the inverter circuit 10 include the source line 15U for the U-phase direct-coupled FET 22, the source line 15V for the V-phase direct-coupled FET 24 and the source line 15W for the W-phase direct-coupled FET 26.

The configuration of connection of the FETs 21 to 26 will be described in detail. The drain terminal 20D of the U-phase direct-coupled FET 21 is electrically connected to the power supply 2 by the drain line 11U. The gate terminal 20O of the U-phase direct-coupled FET 21 is electrically connected to the control circuit 40 by the upper-row gate line 12U. The source terminal 20S of the U-phase direct-coupled FET 21 and the drain terminal 20D of the U-phase direct-coupled FET 22 are electrically connected to each other by the serial line 13U. The gate terminal 200 of the U-phase direct-coupled FET 22 is electrically connected to the control circuit 40 by the lower-row gate line 14U. The source terminal 20S of the U-phase direct-coupled FET 22 is connected to the reference potential point by the source line 15U.

The serial line 13U is electrically connected to the U-phase coil 3U. Thus, the U-phase coil 3U of the motor 3 is electrically connected between the U-phase direct-coupled FETs 21, 22 in the inverter circuit 10.

The drain terminal 20D of the V-phase direct-coupled FET 23 is electrically connected to the power supply 2 by the drain line 11V. The gate terminal 20G of the V-phase direct-coupled FET 23 is electrically connected to the control circuit 40 by the upper-row gate line 12V. The source terminal 20S of the V-phase direct-coupled FET 23 and the drain terminal 20D of the V-phase direct-coupled FET 24 are electrically connected to each other by the serial line 13V. The gate terminal 200 of the V-phase direct-coupled FET 24 is electrically connected to the control circuit 40 by the lower-row gate line 14V. The source terminal 20S of the V-phase direct-coupled FET 24 is connected to the reference potential point by the source line 15V.

The serial line 13V is electrically connected to the V-phase coil 3V. Thus, the V-phase coil 3V of the motor 3 is electrically connected between the V-phase direct-coupled FETs 23, 24 in the inverter circuit 10.

The drain terminal 20D of the W-phase direct-coupled FET 25 is electrically connected to the power supply 2 by the drain line 11W. The gate terminal 200 of the W-phase direct-coupled FET 25 is electrically connected to the control circuit 40 by the upper-row gate line 12W. The source terminal 20S of the W-phase direct-coupled FET 25 and the drain terminal 20D of the W-phase direct-coupled FET 26 are electrically connected to each other by the serial line 13W. The gate terminal 20G of the W-phase direct-coupled FET 26 is electrically connected to the control circuit 40 by the lower-row gate line 14W. The source terminal 20S of the W-phase direct-coupled FET 26 is connected to the reference potential point by the source line 15W.

The serial line 13W is electrically connected to the W-phase coil 3W. Thus, the W-phase coil 3W of the motor 3 is electrically connected between the W-phase direct-coupled FETs 25, 26 in the inverter circuit 10.

The rotation angle sensor 30 detects the rotation angle of the motor 3. The rotation angle sensor 30 outputs the detected rotation angle of the motor 3 to the control circuit 40. The control circuit 40 controls the inverter circuit 10 by controlling switching operations of the FETs 21 to 26 on the basis of the detected rotation angle of the motor 3.

The operation of the motor control device 1 will be described. The motor control device 1 controls electric power, which is supplied to the motor 3, by controlling the inverter circuit 10 with the use of the control circuit 40. As electric power is supplied to the motor 3, the stator 3A generates revolving magnetic fields, and the rotor 3B rotates. The control circuit 40 executes feedback control over the inverter circuit 10 on the basis of the detected rotation angle of the rotor 3B.

Figure 2:
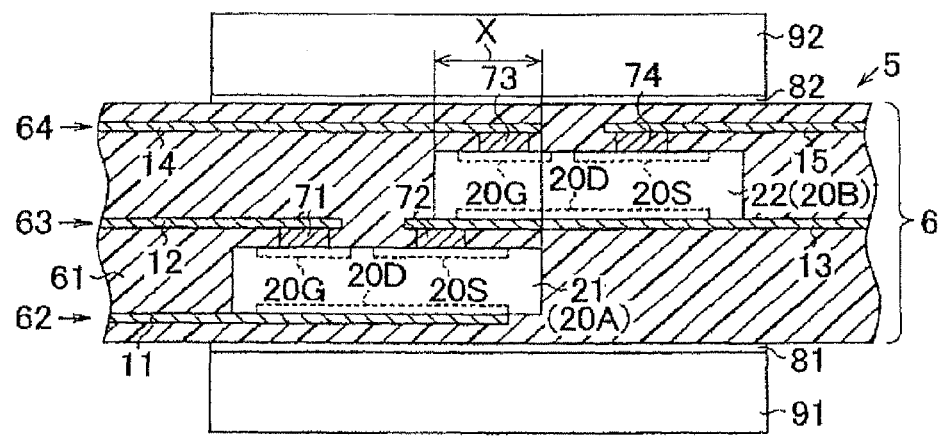
FIG. 2 is a sectional view that shows the sectional structure of a motor control multilayer circuit board according to the embodiment.

A motor control multilayer circuit board 5 (hereinafter, "circuit board 5") that includes the inverter circuit 10 shown in FIG. 1 will be described with reference to FIG. 2. FIG. 2 is a sectional view of the circuit board 5 at a portion including the U-phase direct-coupled FETs 21, 22. The V-phase direct-coupled FET 23 and the W-phase direct-coupled FET 25 shown in FIG. 1 are also arranged similarly to the U-phase direct-coupled FET 21 in the circuit board 5, so the FETs 21, 23, 25 are referred to as "upper-row FETs 20A", and the description of the upper-row FET 20A that is the U-phase direct-coupled FET 21 also applies to the description of the V-phase direct-coupled FET 23 and the description of the W-phase direct-coupled FET 25. In addition, the V-phase direct-coupled FET 24 and the W-phase direct-coupled FET 26 shown in FIG. 1 are also arranged similarly to the U-phase direct-coupled FET 22 in the circuit board 5, so the FETs 22, 24, 26 are referred to as "lower-row FETs 20B", and the description of the lower-row FET 20B that is the U-phase direct-coupled FET 22 also applies to the description of the V-phase direct-coupled FET 24 and the description of the W-phase direct-coupled FET 26.

The circuit board 5 includes a multilayer printed wiring board 6, the upper-row FET 20A, the lower-row FET 20B, insulators 81, 82 and heat dissipation mechanisms 91, 92. The multilayer printed wiring board 6 includes an insulator 61, a plurality of conductor layers 62, 63, 64 and a plurality of vias 71, 72, 73, 74.

The insulator 61 supports the conductor layers 62, 63, 64. The conductor layers 62, 63, 64 overlap with one another in the thickness direction of the multilayer printed wiring board 6. The laminated conductor layers 62, 63, 64 are function as conductor layers of internal layers arranged inside the insulator 61. The conductor layer 62 includes the drain line 11. The conductor layer 63 includes the upper-row gate line 12 and the serial line 13. The conductor layer 64 includes the lower-row gate line 14 and the source line 15.

The vias 71, 72, 73, 74 function as interlayer connection members for connecting the layers. The via 71 connects the upper-row FET 20A and the upper-row gate line 12 of the conductor layer 63 to each other. The via 72 connects the upper-row FET 20A and the serial line 13 of the conductor layer 63 to each other. The via 73 connects the lower-row FET 20B and the lower-row gate line 14 of the conductor layer 64 to each other. The via 74 connects the lower-row FET 20B and the source line 15 of the conductor layer 64 to each other.

The upper-row FET 20A and the lower-row FET 20B each are formed of a bare chip. The upper-row FET 20A and the lower-row FET 20B each have the gate terminal 200 and the source terminal 20S at one surface and the drain terminal 201) at the other surface. In the laminated direction in which the conductor layers 62, 63, 64 are laminated, that is, the thickness direction of the multilayer printed wiring board 6, the upper-row FET 20A and the lower-row FET 20B are arranged in overlapped position.

The upper-row FET 20A is arranged on the conductor layer 62. The drain terminal 20D of the upper-row FET 20A is connected to the drain line 11 of the conductor layer 62. The gate terminal 20G of the upper-row FET 20A is connected to the upper-row gate line 12 of the conductor layer 63 through the via 71. The source terminal 20S of the upper-row FET 20A is connected to the conductor layer 63 that constitutes the serial line 13 through the via 72 that constitutes the serial line 13.

The lower-row FET 20B is arranged on the conductor layer 63. The drain terminal 20D of the lower-row FET 20B is connected to the serial line 13 of the conductor layer 63. The gate terminal 200 of the lower-row FET 20B is connected to the lower-row gate line 14 of the conductor layer 64 through the via 73. The source terminal 20S of the lower-row FET 20B is connected to the conductor layer 64 that constitutes the source line 15 through the via 74 that constitutes the source line 15.

The insulators 81, 82 prevent a short circuit in a circuit (not shown) on the surface of the multilayer printed wiring board 6. The insulators 81, 82 are, for example, formed of an electrically insulating material having a high coefficient of thermal conductivity, such as ceramics. Between both surfaces of the multilayer printed wiring board 6, the insulator 81 is arranged on a surface close to the upper-row FET 20A between the upper-row FET 20A and the lower-row FET 20B. Between both surfaces of the multilayer printed wiring board 6, the insulator 82 is arranged on a surface close to the lower-row FET 20B between the upper-row FET 20A and the lower-row FET 20B.

The heat dissipation mechanisms 91, 92 dissipate heat that is generated from the upper-row FET 20A and the lower-row FET 20B. The heat dissipation mechanisms 91, 92 each are, for example, formed of a cooler, a heat sink, or the like. In the laminated direction in which the conductor layers 62, 63, 64 are laminated, the heat dissipation mechanisms 91, 92 are arranged at locations at which the heat dissipation mechanisms 91, 92 overlap with the upper-row FET 20A and the lower-row FET 20B.

Figure 3:
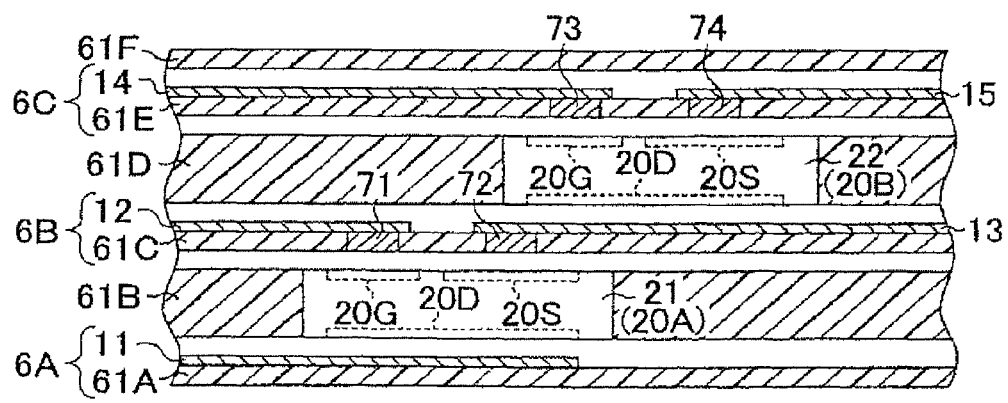
FIG. 3 is a sectional view that shows the sectional structure of each of printed wiring boards that constitute the motor control multilayer circuit board according to the embodiment.

A manufacturing method for the circuit board 5 will be described. As shown in FIG. 3, a board 6A, a thermoplastic resin sheet 61B, the upper-row FET 20A, a board 613, a thermoplastic resin sheet 61D, the lower-row FET 20B, a board 6C and a thermoplastic resin sheet 61F are prepared.

The configuration of the prepared board 6A, thermoplastic resin sheet 61B, upper-row FET 20A, board 613, thermoplastic resin sheet 61D, lower-row FET 20B, board 6C and thermoplastic resin sheet 61F will be described. The board 6A has a thermoplastic resin sheet 61A and the drain line 11. The drain line 11 is formed on the thermoplastic resin sheet 61A. The thermoplastic resin sheet 6113 buries a gap between the board 6A and the board 613 when the board 6A and the board 6B are laminated via the upper-row FET 20A. The board 6B has a thermoplastic resin sheet 61C, the upper-row gate line 12, the serial line 13 and the vias 71, 72. The upper-row gate line 12 and the serial line 13 are formed on the thermoplastic resin sheet 61C. The vias 71, 72 extend through the thermoplastic resin sheet 61C. The via 71 has the upper-row gate line 12 as its bottom face, and the via 72 has the serial line 13 as its bottom face. The thermoplastic resin sheet 61D buries a gap between the board 6B and the board 6C when the board 6B and the board 6C are laminated via the lower-row FET 203. The board 6C has a thermoplastic resin sheet 61E, the lower-row gate line 14, the source line 15 and the vias 73, 74. The lower-row gate line 14 and the source line 15 are formed on the thermoplastic resin sheet 61E. The vias 73, 74 extend through the thermoplastic resin sheet 61E. The via 73 has the lower-row gate line 14 as its bottom face, and the via 74 has the source line 15 as its bottom face. The thermoplastic resin sheet 61F covers the lower-row gate line 14 and the source line 15 on the thermoplastic resin sheet 61E when thermoplastic resin sheet 61F is laminated on the board 6C.

The above-described board 6A, thermoplastic resin sheet 61B, upper-row FET 20A, board 6B, thermoplastic resin sheet 61D, lower-row FET 2013, board 6C and thermoplastic resin sheet 61F are laminated.

The board 6A, the thermoplastic resin sheet 61B, the upper-row FET 20A, the board 63, the thermoplastic resin sheet 61D, the lower-row FET 20B, the board 6C and the thermoplastic resin sheet 61F are pressed while being heated. Thus, the multilayer printed wiring board 6 is manufactured. The thermoplastic resin sheets 61A, 61B, 61C, 61D, 61E heated in this hot pressing process melt, and, after that, is cured by stop heating. The insulator 61 shown in FIG. 2 is fowled from the cured thermoplastic resin sheets 61A, 613, 61C, 61D, 613.

After that, the circuit board 5 is obtained by arranging the heat dissipation mechanisms 91, 92 on the surfaces of the multilayer printed wiring board 6 via the insulators 81, 82. The circuit board 5 is mounted on the in-vehicle motor control device.

The operation of the embodiment will be described. When the upper-row FET 20A and the lower-row FET 20B are overlapped with each other, an overlapped portion X (see FIG. 2) of the upper-row FET 20A and the lower-row FET 20B is formed in the multilayer printed wiring board 6. Therefore, it is possible to reduce the area of the overlapped portion X from the multilayer printed wiring board in which the upper-row FET 20A and the lower-row FET 20B are arranged on one surface.

Heat generated from the upper-row FET 20A is transferred to the heat dissipation mechanism 91 implemented on one surface of the multilayer printed wiring board 6, and heat generated from the lower-row FET 20B is transferred to the heat dissipation mechanism 92 implemented on the other surface of the multilayer printed wiring board 6.

The circuit board 5 according to the present embodiment has the following advantageous effects.

(1) In the laminated direction in which the conductor layers 62, 63, 64 are laminated, the U-phase direct-coupled FET 21 and the U-phase direct-coupled FET 22 overlap with each other. Therefore, in comparison with the case where the U-phase direct-coupled FET 21 and the U-phase direct-coupled FET 22 are arranged on the surface of the multilayer printed wiring board 6, it is possible to reduce the area of the multilayer printed wiring board 6. In addition, it is possible to dissipate heat generated from the U-phase direct-coupled FET 21 with the use of the heat dissipation mechanism 91 that overlaps with the U-phase direct-coupled FET 21 in the above laminated direction, and it is possible to dissipate heat generated from the U-phase direct-coupled FET 22 with the use of the heat dissipation mechanism 92 that overlaps with the U-phase direct-coupled FET 22 in the above laminated direction.

(2) In the laminated direction in which the conductor layers 62, 63, 64 are laminated, the V-phase direct-coupled FET 23 and the V-phase direct-coupled FET 24 overlap with each other. Therefore, in comparison with the case where the V-phase direct-coupled FET 23 and the V-phase direct-coupled FET 24 are arranged on the surface of the multilayer printed wiring board 6, it is possible to reduce the area of the multilayer printed wiring board 6. In addition, it is possible to dissipate heat generated from the V-phase direct-coupled FET 23 with the use of the heat dissipation mechanism 91 that overlaps with the V-phase direct-coupled FET 23 in the above laminated direction, and it is possible to dissipate heat generated from the V-phase direct-coupled FET 24 with the use of the heat dissipation mechanism 92 that overlaps with the V-phase direct-coupled FET 24 in the above laminated direction.

(3) In the laminated direction in which the conductor layers 62, 63, 64 are laminated, the W-phase direct-coupled FET 25 and the W-phase direct-coupled FET 26 overlap with each other. Therefore, in comparison with the case where the W-phase direct-coupled FET 25 and the W-phase direct-coupled FET 26 are arranged on the surface of the multilayer printed wiring board 6, it is possible to reduce the area of the multilayer printed wiring board 6. In addition, it is possible to dissipate heat generated from the W—phase direct-coupled FET 25 with the use of the heat dissipation mechanism 91 that overlaps with the W-phase direct-coupled FET 25 in the above laminated direction, and it is possible to dissipate heat generated from the W-phase direct-coupled FET 26 with the use of the heat dissipation mechanism 92 that overlaps with the W-phase direct-coupled FET 26 in the above laminated direction.

(4) Both the U-phase direct-coupled FET 21 and the U-phase direct-coupled FET 22 are incorporated in the multilayer printed wiring board 6. Therefore, it is not required to arrange the U-phase direct-coupled FET 21 and the U-phase direct-coupled FET 22 on the surface of the multilayer printed wiring board 6. Thus, it is possible to further increase the flexibility of design and arrangement of the heat dissipation mechanisms 91, 92 that are arranged on the surfaces of the multilayer printed wiring board 6.

(5) Both the V-phase direct-coupled FET 23 and the V-phase direct-coupled FET 24 are incorporated in the multilayer printed wiring board 6. Therefore, it is not required to arrange the V-phase direct-coupled FET 23 and the V-phase direct-coupled FET 24 on the surface of the multilayer printed wiring board 6. Thus, it is possible to further increase the flexibility of design and arrangement of the heat dissipation mechanisms 91, 92 that are arranged on the surfaces of the multilayer printed wiring board 6.

(6) Both the W-phase direct-coupled FET 25 and the W-phase direct-coupled FET 26 are incorporated in the multilayer printed wiring board 6. Therefore, it is not required to arrange the W-phase direct-coupled FET 25 and the W-phase direct-coupled FET 26 on the surface of the multilayer printed wiring board 6. Thus, it is possible to further increase the flexibility of design and arrangement of the heat dissipation mechanisms 91, 92 that are arranged on the surfaces of the multilayer printed wiring board 6.

(7) The U-phase direct-coupled FET 21 and the U-phase direct-coupled FET 22 overlap with each other in the above-described laminated direction, so the serial line 13U that serially connects the high potential-side switching element and the low potential-side switching element to each other can be, formed of a via, and it is possible to shorten the serial line 13U.

(8) The V-phase direct-coupled FET 23 and the V-phase direct-coupled FET 24 overlap with each other in the above-described laminated direction, so the serial line 13V that serially connects the high potential-side switching element and the low potential-side switching element to each other can be, formed of a via, and it is possible to shorten the serial line 13V.

(9) The W-phase direct-coupled FET 25 and the W-phase direct-coupled FET 26 overlap with each other in the above-described laminated direction, so the serial line 13W that serially connects the high potential-side switching element and the low potential-side switching element to each other can be, formed of a via, and it is possible to shorten the serial line 13W.

(10) The source terminal 20S of the U-phase direct-coupled FET 21 is arranged at a location at which the source terminal 20S of the U-phase direct-coupled FET 21 overlaps with the drain terminal 20D of the U-phase direct-coupled FET 22 in the above-described laminated direction, so it is possible to reduce the distance from the source terminal 20S of the U-phase direct-coupled FET 21 to the drain terminal 20D of the U-phase direct-coupled FET 22. Thus, it is possible to further shorten the serial line 13U.

(11) The source terminal 20S of the V-phase direct-coupled FET 23 is arranged at a location at which the source terminal 20S of the V-phase direct-coupled FET 23 overlaps with the drain terminal 20D of the V-phase direct-coupled FET 24 in the above-described laminated direction, so it is possible to reduce the distance from the source terminal 20S of the V-phase direct-coupled FET 23 to the drain terminal 20D of the V-phase direct-coupled FET 24. Thus, it is possible to further shorten the serial line 13V.

(12) The source terminal 20S of the W-phase direct-coupled FET 25 is arranged at a location at which the source terminal 20S of the W-phase direct-coupled FET 25 overlaps with the drain terminal 20D of the W-phase direct-coupled FET 26 in the above-described laminated direction, so it is possible to reduce the distance from the source terminal 20S of the W-phase direct-coupled FET 25 to the drain terminal 20D of the W-phase direct-coupled FET 26. Thus, it is possible to further shorten the serial line 13W.

(13) The heat dissipation mechanisms 91, 92 are respectively arranged on both surfaces of the multilayer printed wiring board 6 via the insulators 81, 82. Therefore, in comparison with a configuration that a heat dissipation mechanism is arranged only on one surface of the multilayer printed wiring board 6, it is possible to improve the heat dissipation effect.

The invention includes embodiments other than the above-described embodiment. Hereinafter, alternative embodiments to the above-described embodiment will be described as other embodiments of the invention. The following alternative embodiments may be combined with each other.

In the circuit board 5 according to the embodiment, the FETs 21 to 26 are power MOSFETs. In contrast, in the circuit board 5 according to an alternative embodiment, the FETs 21 to 26 are junction FETs. In the circuit board 5 according to the embodiment, the upper-row FET 20A and the lower-row FET 20B overlap with each other. In contrast, in the circuit board 5 according to an alternative embodiment, for example, the U-phase direct-coupled FET 21 and the V-phase direct-coupled FET 23 are arranged in overlapped position. That is, the overlapped FETs 20 do not need to be serially connected to each other.

In the circuit board 5 according to the embodiment, both the upper-row FET 20A and the lower-row FET 20B are incorporated in the multilayer printed wiring board 6. In contrast, in the circuit board 5 according to an alternative embodiment, any one of the upper-row FET 20A and the lower-row FET 20B is incorporated in the multilayer printed wiring board 6. In addition, in the circuit board 5 according to an alternative embodiment, both the upper-row FET 20A and the lower-row FET 20B are not incorporated in the multilayer printed wiring board 6 but are implemented on the surface of the multilayer printed wiring board 6.

In the circuit board 5 according to the embodiment, the heat dissipation mechanisms 91, 92 are respectively arranged on both surfaces of the multilayer printed wiring board 6. In contrast, in the circuit board 5 according to an alternative embodiment, a heat dissipation mechanism is arranged on any one of the surfaces of the multilayer printed wiring board 6.

What is claimed is:

1. A motor control multilayer circuit board comprising:
   a multilayer printed wiring board having a plurality of laminated conductor layers;
   a first field-effect transistor connected to the conductor layers and configured to control a motor;
   a second field-effect transistor connected to the conductor layers and arranged at a location at which the second field-effect transistor overlaps with the first field-effect transistor in a laminated direction in which the conductor layers are laminated, the second field-effect transistor being configured to control the motor; and a heat dissipation mechanism arranged on the multilayer printed wiring board and arranged at a location at which the heat dissipation mechanism overlaps with at least one of the first field-effect transistor and the second field-effect transistor in the laminated direction wherein the first field-effect transistor and the second field-effect transistor are serially connected to each other by a serial line, the first field-effect transistor is configured to function as a switching element that is arranged on a higher potential side than the second field-effect transistor, the second field-effect transistor is configured to function as a switching element that is arranged on a lower potential side than the first field-effect transistor, the first field-effect transistor and the second field-effect transistor each are a power MOSFET having a gate terminal and a source terminal at one surface and having a drain terminal at the other surface, and the source terminal of the first field-effect transistor is arranged at a position at which the source terminal of the first field-effect transistor overlaps with the drain terminal of the second field-effect transistor in the laminated direction.

2. The motor control multilayer circuit board according to claim 1, wherein
at least one of the first field-effect transistor and the second field-effect transistor is incorporated in the multilayer printed wiring board.

3. The motor control multilayer circuit board according to claim 1, wherein
both the first field-effect transistor and the second field-effect transistor are incorporated in the multilayer printed wiring board.

4. The motor control multilayer circuit board according to claim 1, wherein
the heat dissipation mechanism is arranged on each surface of the multilayer printed wiring board via an insulator.

* * * * *